(12) United States Patent
Hillman

(10) Patent No.: US 6,794,300 B1
(45) Date of Patent: Sep. 21, 2004

(54) MECHANICALLY SCANNED WET CHEMICAL PROCESSING

(75) Inventor: Gary Hillman, Livingston, NJ (US)

(73) Assignee: Creative Design Corp., Montville, NJ (US)

( * ) Notice: Subject to any disclaimer, the term of this patent is extended or adjusted under 35 U.S.C. 154(b) by 140 days.

(21) Appl. No.: 10/213,531

(22) Filed: Aug. 7, 2002

Related U.S. Application Data

(60) Provisional application No. 60/311,438, filed on Aug. 10, 2001.

(51) Int. Cl.[7] .................................. H01L 21/302
(52) U.S. Cl. ...................... 438/710; 438/758
(58) Field of Search .................. 438/710, 758

(56) References Cited

U.S. PATENT DOCUMENTS

| | | | | |
|---|---|---|---|---|
| 4,856,456 A | * | 8/1989 | Hillman et al. ............. | 118/500 |
| 5,094,884 A | * | 3/1992 | Hillman et al. ............. | 438/782 |
| 5,745,946 A | * | 5/1998 | Thrasher et al. ............. | 15/77 |
| 6,059,888 A | * | 5/2000 | Hillman ...................... | 134/6 |
| 6,273,105 B1 | * | 8/2001 | Jones ......................... | 134/64 R |
| 6,631,726 B1 | * | 10/2003 | Kinoshita et al. ......... | 134/102.1 |

* cited by examiner

*Primary Examiner*—John R Nailing
*Assistant Examiner*—Olivia T. Luk
(74) *Attorney, Agent, or Firm*—Lerner, David, Littenberg, Krumholz & Mentlik, LLP

(57) ABSTRACT

A substrate such as a semiconductor wafer is move across the top of an open trough while a liquid is maintained in the trough at a level just above the walls of the trough, as by supplying the liquid to the trough so that the liquid gently overflows the trough. The downwardly-facing surface of the substrate contacts the liquid. The substrate is moved at a constant rate so that the duration of contact is the same for all portions of the surface.

13 Claims, 2 Drawing Sheets

US 6,794,300 B1

MECHANICALLY SCANNED WET CHEMICAL PROCESSING

CROSS-REFERENCE TO RELATED APPLICATIONS

The present application claims benefit of U.S. Provisional Patent Application Serial No. 60/311,438, filed Aug. 10, 2001, the disclosure of which is hereby incorporated by reference herein.

BACKGROUND OF THE INVENTION

The present invention relates to methods and apparatus for treating substrates such as semiconductor wafers with liquids.

In the semiconductor processing art, it is often necessary to treat a semiconductor wafer with a liquid. A typical semiconductor wafer has a flat active surface that must be exposed to liquids such as developers for developing photoresists, electroless plating solutions and electroplating solutions, as well as rinsing liquids that are commonly used to remove other liquids. In many cases, it is important to expose all parts of the active surface to the liquid for the same length of time. For example, to etch a wafer surface uniformly using a chemical etchant, the entire surface should be exposed to the etchant for the same duration. If a wafer is dipped into an etchant bath with the active surface extending vertically, the part of the active surface at the bottom of the wafer will enter the bath first as the wafer is immersed, and will leave the bath last as the wafer is withdrawn from the bath. This part of the active surface will be exposed for a longer time than the part of the active surface near the top of the wafer. Because the wafer must be immersed and withdrawn at a moderate speed to avoid turbulence and bubble entrainment, the difference in exposure time can be considerable. This difference is especially significant where the total exposure time is small as, for example, with a fast-acting etchant. Similar problems arise in treatment with other liquid solutions.

In other wafer processing techniques, the wafer is moved downwardly into the liquid with the active surface in a horizontal orientation and facing downwardly. In theory, the entire surface can enter the liquid at the same time and can leave the liquid at the same time. In practice, however, this approach tends to trap air bubbles at the surface, leading to non-uniform contact. Other liquid contacting methods such as spraying suffer from other drawbacks, including difficulty in assuring uniform contacting conditions for the entire active surface.

The present invention provides apparatus and methods, which alleviate these drawbacks.

SUMMARY OF THE INVENTION

One aspect of the invention provides methods of treating a solid substrate such as a semiconductor wafer with one or more liquids. A method according to this aspect of the invention desirably includes the steps of providing a first liquid in a first vessel having an open top and moving the substrate in a feed direction across the vessel so that a surface of the substrate faces downwardly and successive portions of such surface contact the liquid in the vessel as such portions pass across the vessel. The step of providing a first liquid may include the step of continually feeding the first liquid into the vessel so that the first liquid continually overflows the first vessel, most preferably in a slow, steady flow at the minimum rate required to maintain the surface of the first liquid just slightly above the edge of the vessel. The first vessel may be an elongated trough having upstream and downstream edges at the top of the first vessel extending substantially parallel to one another and substantially transverse to the feed direction.

The surface of the substrate preferably moves across the vessel at a substantially constant velocity, so that every portion of the substrate surface is exposed to the liquid for substantially the same length of time. The method may also include the step of providing a second liquid in a second vessel having an open top, said second vessel being offset from said first vessel in said feed direction so that each portion of the substrate passes across the second vessel and contacts the second liquid after contacting the first liquid. More than two vessels may be employed.

A further aspect of the invention provides apparatus for treating a substrate. Apparatus according to this aspect of the invention may include a first vessel having an open top and a first liquid source connected to the first vessel. The first liquid source is constructed and arranged to provide a first liquid in said first vessel so that the first liquid rises above the top of the first vessel. The apparatus also includes a conveyor arranged to convey a substrate over the first vessel in a feed direction so that a surface of the substrate faces downwardly and such surface moves across the first vessel and contacts the first liquid. As discussed above in connection with the method, the apparatus may also include a second vessel and second liquid source.

These and other objects, features and advantages of the present invention will be more readily apparent from the detailed description of the preferred embodiments set forth below, taken in conjunction with the accompanying drawings.

DETAILED DESCRIPTION

Figure 1:
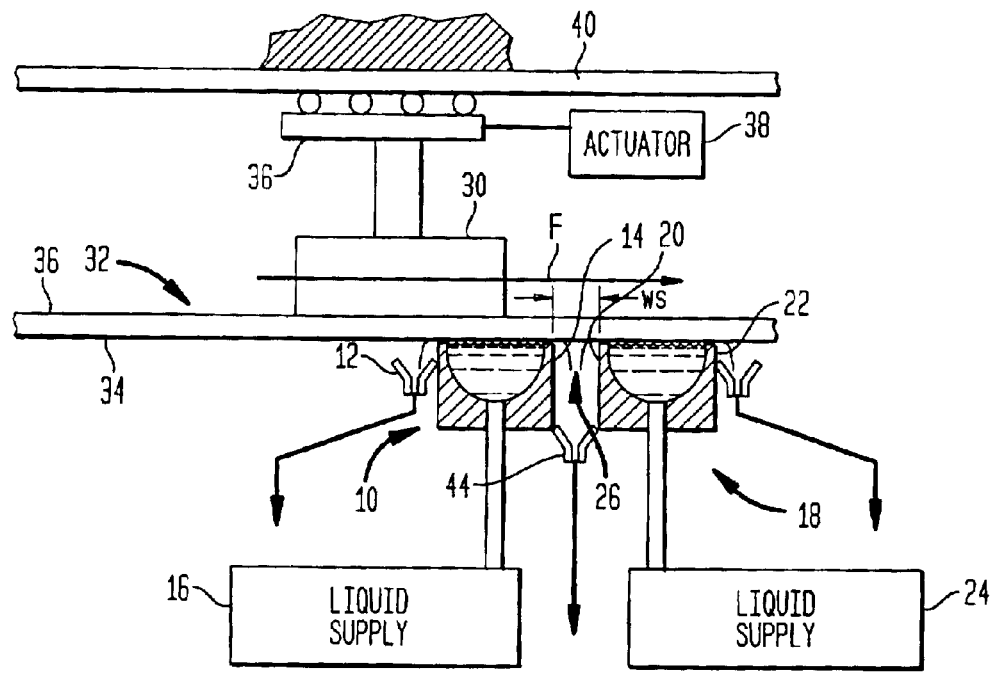
FIG. 1 is a diagrammatic, partially sectional, elevational view of apparatus in accordance with one embodiment of the invention in conjunction with a substrate being processed.
Figure 2:
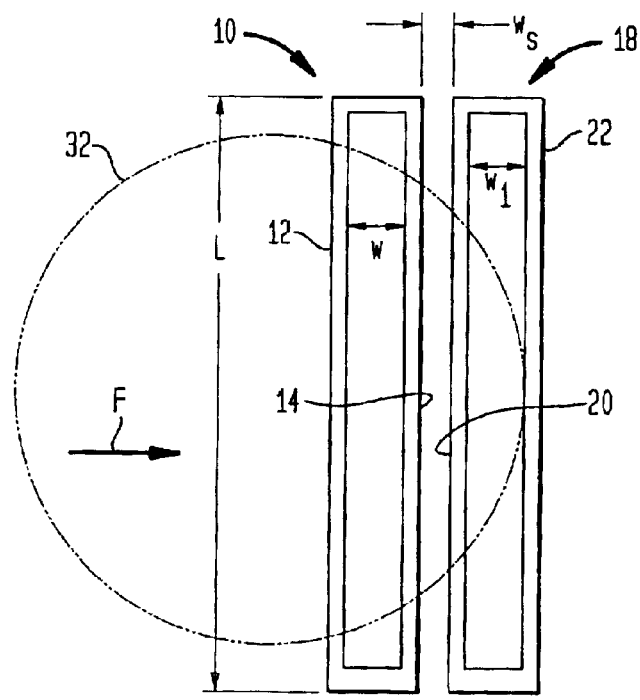
FIG. 2 is a diagrammatic top plan view of the apparatus and substrate of FIG. 1, with certain components removed for clarity of illustration.

Apparatus in accordance with one embodiment of the invention (FIGS. 1 and 2) includes a first vessel 10 in the form of an elongated trough having an open top. The vessel or trough 10 has a wall structure defining an upstream edge 12 and a downstream edge 14. The upstream wall 12 extends generally parallel to the downstream wall 14 so that the width w of the trough is substantially constant over the entire length 1 of the trough. The second vessel also has a wall structure including an upstream edge 20 and a downstream edge 22. The apparatus also includes a second vessel 18 also in the form of an elongated trough having an open top. The upstream wall of the second vessel 18 extends parallel to the downstream wall 22 of that vessel so that its width w' is also substantially constant. The second vessel 18 is disposed alongside the first vessel 10 so that the upstream wall 20 of the second vessel is generally parallel to the downstream wall 14 of the first vessel. There is a space or transition region 26 between the downstream wall 14 of the first vessel 10 and the upstream wall 20 and this space also has a substantially constant dimension or width $w_s$ along the lengths of the troughs.

A first liquid supply unit 16 is connected to the first vessel 10. The second vessel is connected to a second liquid supply unit 24. The liquid supply units 16 and 24 may include essentially any conventional liquid handling equipment as, for example, tanks, pumps, filters and control devices such as pressure and flow measuring equipment. Alternatively or additionally, the liquid supply units may include connections to external sources of liquids as, for example, connections to utility lines in an industrial plant carrying distilled water or other processed liquids. The apparatus further includes a chuck such as a vacuum chuck 30 arranged to engage a semiconductor wafer 32 so that the front or active surface 34 of the wafer faces downwardly and is positioned at a level just slightly above the tops of vessel or troughs 10 and 18. Chuck 30 is mounted on a moveable element 36, which, in turn, is connected to an actuator 38 arranged to move the moveable element 36 and chuck 30 in a horizontal path in a feed direction f transverse to the lengthwise direction 1 of the troughs or vessels 10, 18. The actuator may include essentially any form of mechanical, electromechanical, hydraulic, pneumatic or other mechanism arranged to move the wafer in the desired horizontal path relative to the troughs. Merely by way of example, the moveable element 36 and, hence, chuck 30 may be slidably mounted on one or more rails 40 extending in the feed direction using conventional sliding or roller bearings. The height of rails 40 may be adjustable in relation to troughs 10 and 18. In a further variant, the same relative motion can be imparted by moving the troughs relative to the surroundings while maintaining the wafer in fixed position relative to the surroundings, or by moving both the wafer and the troughs relative to the surroundings.

In operation, in a method according to a further aspect of the invention, the liquid supply units are operated to supply a first liquid such as an etchant, plating bath, photoresist developer or other active liquid to the first vessel or trough 10 and to supply a rinse liquid such as water to the second vessel or trough 18. The flow rates into the troughs are selected so that the liquids overflow the troughs very slowly as, for example, at a rate of a few ml per minute or a few ml per second. The actuator moves the chuck 30 and wafer 34 at a constant linear speed. As the wafer moves downstream in the feed direction f, each portion of the wafer passes across the first trough and across the second trough.

The overflowing fluid rises to a level just slightly above the tops of the upstream and downstream walls of the troughs. The rise height (the height of the liquid above the walls) will depend on factors including the surface tension between the fluid and the walls of the trough; surface tension between the fluid and the active surface of the wafer; and the overflow rate. However, the height of the wafer active surface 34 above the walls of the trough should be equal to or less than the rise height so that the active surface contacts the liquid. The wafer surface desirably passes less than about 1.5–0.5 mm or less above the solid wall of each trough. Under these conditions, the liquid within each trough uniformly contacts that portion of the wafer surface that is aligned with the trough at any given instant, without entrapping air or other gas bubbles. As the wafer moves in the feed direction, successive portions of the wafer surface are aligned with each trough for the same length of time. Thus, each portion of the wafer surface is exposed to the first liquid in trough 10 for the same length of time as every other portion of the wafer surface. Similarly, every portion of the wafer surface is exposed to the second liquid in trough 18 for the same length of time.

Within the transition zone 26 between the downstream edge of 14 of trough 10 and the upstream edge 20 of trough 18, the first liquid drains from the wafer surface. The transition zone is connected to an outlet connection 44. This outlet connection may be restricted so as to provide a liquid bath in the transition zone. In this condition, there is a continual transition in the composition of fluid in contact with the wafer surface within the transition zone. Nearer to the downstream edge 14 of first vessel 10, the fluid in contact with the wafer surface consists almost entirely of the first fluid from vessel 10. Nearer the upstream edge 20 of second vessel 18, the fluid in contact with the wafer surface consists almost entirely of the second fluid from vessel 18. Preferably, the width $W_s$ of the transition zone is substantially smaller than the widths of the troughs, so that each portion of the wafer is exposed to the fluid in the transition zone for a duration substantially smaller than the duration of exposure to the first fluid in vessel 10 and substantially smaller than the duration of exposure to the second fluid in vessel 18. For example, the width $w_s$ of the transition zone may be less than about 0.2 times and desirably less than about 0.1 times the width w of the first vessel. Alternatively, the fluid flow at the outlet 44 from the transition zone may be unrestricted and may be connected to a drain or to the suction side of a pump so that liquid does not accumulate in the transition zone and the wafer surface is exposed to air or other ambient gas within the transition zone. Here again, however, it desirable to keep the transition zone width $w_s$ substantially smaller than the widths of the troughs.

It is not essential that the fluid overflow from each trough along both upstream and downstream walls. For example, if the upstream wall 12 of the first vessel or trough 10 is slightly higher than the downstream wall 14, the fluid will overflow primarily or exclusively at the downstream wall. Conversely, the upstream wall 20 of second vessel or trough 18 may be slightly lower than the downstream wall 22 of that trough, so that the fluid overflows primarily or exclusively at the upstream wall of the second vessel 18. In a further variant, where the fluid from the two troughs overflow exclusively into the transition zone, the fluid outlet 44 of the transition zone may be connected to the inlet of a positive displacement pump set to pump fluid out of the transition zone at a predetermined outlet rate. The fluid supply to the vessels also may be set at predetermined rates, and the aggregate of these supply rates may be equal to the outlet rate.

It should be appreciated that although the fluid may overflow from the vessels, the overflow rates desirably are very small. The fluid at the top of the vessels desirably is static or nearly static. Also, the speed of the wafer desirably is low enough that hydrodynamic phenomena caused by relative motion of the wafer relative to the liquids plays little or no role in the process. For example, the speed of the wafer may be on the order of 5–10 cm/minute. In essence, the slowly-moving wafer contacts a stationary or nearly stationary fluid meniscus rising above the edges of the vessels. The overflow rate may be set at the minimum required to compensate for consumption of fluid constituents, as by reaction with the wafer. Indeed, where the surface tension at the edges of the vessels is strong enough to maintain the meniscus at the edges of the troughs, the fluid may not overflow at all. In this variant, the fluid at the top of the trough may be maintained at a slight positive pressure, which is counterbalanced by the surface tension in the fluid meniscus and the fluid head of the fluid in the small portion of fluid rising above the trough.

Figure 3:
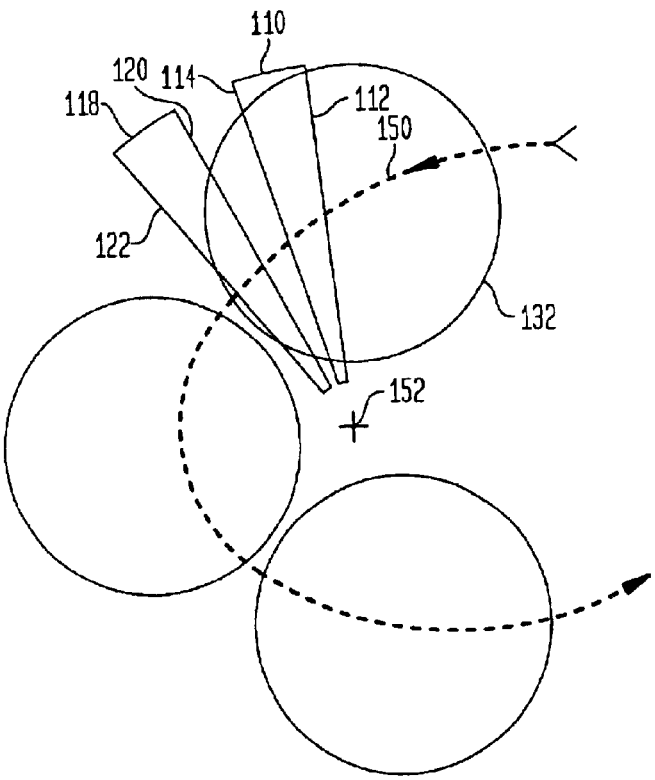
FIG. 3 is a diagrammatic top plan view of apparatus in accordance with a further embodiment of the invention.

Numerous variations and combinations of the features discussed above can be utilized. For example, additional elements such as electrodes for electroplating; ultrasonic or radiant energy application devices and the like can be provided in or on one or more of the troughs. Vibration such as sonic or ultrasonic vibration may be applied to the wafer or to the troughs. In a further variant, the wafer may be initially positioned at a very low height above the vessels to establish a meniscus extending between the vessel wall and the wafer surface, and then elevated slightly while maintaining the meniscus and maintained at the elevated height while the wafer is moved relative to the vessels. Also, the system may include only one vessel or may include more than two vessels. Moreover, the vessels need not be troughs width parallel, straight walls. For example, as seen in FIG. 3, the system may be arranged to move wafers along a generally arcuate path 150 having a center of curvature 152. In this instance, troughs 110 and 118 may be generally in the forms of sectors having upstream and downstream walls 112, 114, 120 and 122 extending generally radially with respect to the center of curvature 152 of the movement path. Provided that each wafer 132 moves with a substantially angular velocity about the center of curvature 152, each section of each wafer will be aligned with a particular trough for the same length of time and, hence, each portion of each wafer will be exposed to a fluid within a particular trough for the same duration.

Figure 4:
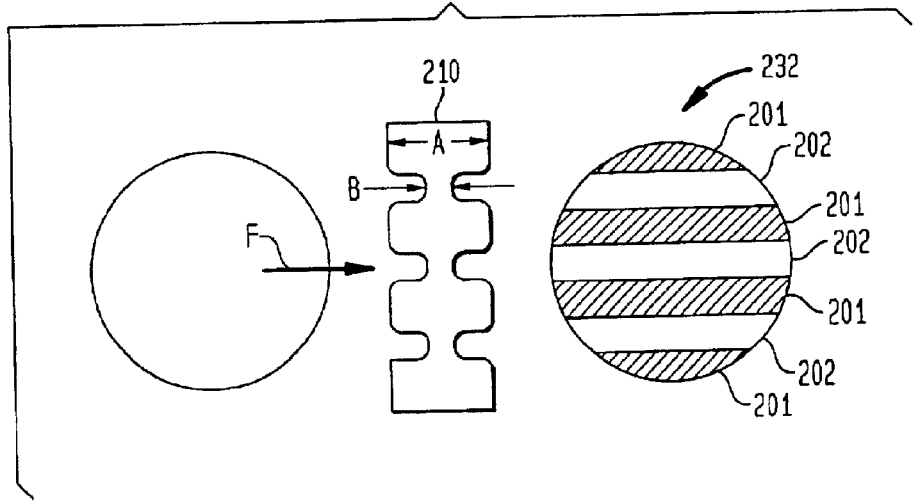
FIG. 4 is a view similar to FIG. 3, depicting apparatus in accordance with yet another embodiment of the invention.

In still other variants, the wall configuration of the troughs may be selected to provide deliberate non-uniformities in exposure time. For example, a trough 210 (FIG. 4) has sections with a large width a and a small width b in the feed direction f. These sections are arranged along the length 1 of the trough. The treated wafer will have heavily treated zones 201 in the regions which pass over the wide portions a of the trough and will have less treated zones 202 in the regions which pass over the narrow portion b of the trough.

In a further variant, a particular trough may be interrupted along its length so as to provide no treatment at all to a portion of each wafer passing over the trough.

As these and other variations can be employed, the foregoing description of the preferred embodiments should be understood as illustrating, rather than limiting, the invention as defined by the claims.

What is claimed is:

1. A method of treating a solid substrate having a surface with one or more liquids comprising the steps of:

(a) providing a first liquid in a first vessel having an open top;

(b) moving the substrate in a feed direction across the vessel so that a surface of the substrate faces downwardly and successive portions of such surface contact the liquid in the vessel as such portions pass across the vessel.

2. A method as claimed in claim 1 wherein said step of providing a first liquid includes the step of continually feeding said first liquid into the vessel so that the first liquid continually overflows the first vessel.

3. A method as claimed in claim 1 wherein said first vessel is an elongated trough having upstream and downstream edges extending substantially parallel to one another and substantially transverse to said feed direction at the top of the first vessel.

4. A method as claimed in claim 3 wherein said surface of said substrate moves across the vessel at a substantially constant velocity, whereby every portion of the substrate surface is exposed to the liquid for substantially the same length of time.

5. A method as claimed in claim 4 wherein said first liquid overflows the first vessel along the downstream edge thereof.

6. A method as claimed in claim 1 further comprising the step of providing a second liquid in a second vessel having an open top, said second vessel being offset from said first vessel in said feed direction so that each portion of the substrate passes across the second vessel and contacts the second liquid after contacting the first liquid.

7. A method as claimed in claim 6 wherein said first and second vessels are spaced apart from one another in the feed direction so that there is a transition zone between said first and second vessels.

8. A method as claimed in any one of claims 1-7 wherein said substrate is a semiconductor wafer.

9. Apparatus for treating a substrate comprising:

(a) a first vessel having an open top;

(b) a first liquid source connected to said first vessel, said liquid source being constructed and arranged to provide a first liquid in said first vessel so that the first liquid rises above the top of the first vessel;

(c) a conveyor arranged to convey a substrate over the first vessel in a feed direction so that a surface of the substrate faces downwardly and such surface moves across the first vessel and contacts the first liquid.

10. Apparatus as claimed in claim 9 wherein said first liquid source is arranged to feed said first liquid into said first vessel so that said first liquid overflows said first vessel.

11. Apparatus as claimed in claim 9 or claim 10 further comprising a second vessel having an open top offset from said first vessel in said feed direction and a second liquid source connected to said second vessel, said second liquid source being constructed and arranged to provide a second liquid in said second vessel.

12. Apparatus as claimed in claim 11 wherein said second liquid source is constructed and arranged to feed said second liquid into said second vessel so that the second liquid overflows the second vessel.

13. Apparatus as claimed in claim 9 wherein said first vessel is in the form of an elongated trough having upstream and downstream edges extending substantially transverse to the feed direction.

* * * * *

UNITED STATES PATENT AND TRADEMARK OFFICE
CERTIFICATE OF CORRECTION

PATENT NO. : 6,794,300 B1
DATED : September 21, 2004
INVENTOR(S) : Gary Hillman

It is certified that error appears in the above-identified patent and that said Letters Patent is hereby corrected as shown below:

<u>Title page,</u>
Item [57], ABSTRACT,
Line 1, "is move" should read -- is moved --.

<u>Column 1,</u>
Line 51, "and methods," should read -- and methods --.

<u>Column 4,</u>
Line 30, "it desirable" should read -- it is desirably --.
Lines 41-42, "troughs over-flow exclusively" should read -- troughs overflows exclusively --.

<u>Column 5,</u>
Line 15, "width parallel" should read -- with parallel --.

Signed and Sealed this

First Day of March, 2005

JON W. DUDAS
*Director of the United States Patent and Trademark Office*